United States Patent
Lai et al.

(10) Patent No.: US 9,537,327 B2
(45) Date of Patent: Jan. 3, 2017

(54) BATTERY CELL BALANCING CONTROL SYSTEM AND BATTERY MANAGEMENT METHOD THEREOF

(71) Applicants: LITE-ON ELECTRONICS (GUANGZHOU) CO., LTD., Guang Zhou (CN); LITE-ON TECHNOLOGY CORPORATION, Taipei (TW)

(72) Inventors: Chiou-Chu Lai, Taipei (TW); Ming-Yao Cheng, Taipei (TW); Chia-Tse Liang, Taipei (TW); Chia-Fu Yeh, Taipei (TW); Chien-Chu Chen, Taipei (TW)

(73) Assignees: LITE-ON ELECTRONICS (GUANGZHOU) CO., LTD., Guang Zhou (CN); LITE-ON TECHNOLOGY CORPORATION, Taipei (TW)

( * ) Notice: Subject to any disclaimer, the term of this patent is extended or adjusted under 35 U.S.C. 154(b) by 259 days.

(21) Appl. No.: 14/104,325

(22) Filed: Dec. 12, 2013

(65) Prior Publication Data

US 2014/0176078 A1    Jun. 26, 2014

Related U.S. Application Data

(60) Provisional application No. 61/740,898, filed on Dec. 21, 2012.

(51) Int. Cl.
*H02J 7/00* (2006.01)
*G01R 31/36* (2006.01)

(52) U.S. Cl.
CPC ......... *H02J 7/0014* (2013.01); *G01R 31/3606* (2013.01)

(58) Field of Classification Search
CPC ........................... H02J 7/0014; G01R 31/3606
USPC .......................................... 320/121, 132, 134
See application file for complete search history.

(56) References Cited

U.S. PATENT DOCUMENTS

| | | | | |
|---|---|---|---|---|
| 2008/0272735 A1* | 11/2008 | Roessler | ............... | H02J 7/0016 320/116 |
| 2009/0278496 A1* | 11/2009 | Nakao | ................... | H02J 7/0016 320/118 |
| 2010/0253286 A1* | 10/2010 | Sutardja | ................ | H02J 7/0014 320/118 |

(Continued)

*Primary Examiner* — Nathaniel Pelton
(74) *Attorney, Agent, or Firm* — Muncy, Geissler, Olds & Lowe, P.C.

(57) ABSTRACT

A battery cell balancing control system and a battery management method thereof are disclosed. The battery cell balancing control system is used for managing a battery apparatus, wherein the battery apparatus has a plurality of battery cells. The battery cell balancing control system comprises a detection module, a battery management module, and an adjusting module. The detection module is used for executing a battery checking procedure on the plurality of battery cells to generate a detection result. The battery management module is used for determining whether the plurality of battery cells has a controlled cell according to the detection result. If the controlled cell has not been found among the plurality of battery cells, the battery management module controls the adjusting module to execute a battery cell balancing procedure until the controlled cell is found.

16 Claims, 9 Drawing Sheets

(56) References Cited

U.S. PATENT DOCUMENTS

2014/0152232 A1* 6/2014 Johnson ............... H02J 7/0014
320/103
2015/0295424 A1* 10/2015 Suzuki ............... H01M 10/441
320/116

* cited by examiner

BATTERY CELL BALANCING CONTROL SYSTEM AND BATTERY MANAGEMENT METHOD THEREOF

BACKGROUND OF THE INVENTION

1. Field of the Invention

The present invention relates to a battery cell balancing control system and to a battery management method thereof; more particularly, it relates to a battery cell balancing control system and a battery management method thereof that can execute a battery cell balancing procedure on a plurality of battery cells of a battery apparatus.

2. Description of the Related Art

It is a common practice to find a plurality of cells arranged in a battery so as to produce enough power for an electrical device that requires a higher amount of power. Notably, after a period of service, the cells in a battery tend to develop different properties such as cell capacity, internal resistance, charging efficiency, and discharging capability. Moreover, cells manufactured in batch production can demonstrate different properties as well. As a consequence, different properties among cells result in imbalances in the cells within a battery. Since the performance of a battery will be limited by imbalances among the cells, it is crucial for a battery to run a cell balancing process in order to maximize the usable capacity, optimize the energy efficiency and extend the service life.

However, an improper balancing routine for cells may lead to a lower available capacity, continuous energy consumption, and continuous heat production, all of which shorten the life of a battery and result in a waste of energy.

Therefore, a battery cell balancing control system and a battery management method thereof are proposed to solve the aforementioned problems.

SUMMARY OF THE INVENTION

A major objective of the present invention is to provide a battery cell balancing control system that is able to execute a battery cell balancing procedure on a plurality of battery cells of a battery apparatus.

Another major objective of the present invention is to provide a battery management method for the aforementioned battery cell balancing control system.

To achieve the above objectives, the battery cell balancing control system is used for managing a battery apparatus, wherein the battery apparatus has a plurality of battery cells. The battery cell balancing control system comprises a detection module, a battery management module, and an adjusting module. The detection module is used for executing a battery checking procedure on the plurality of battery cells. The battery management module is electrically connected to the detection module for determining the controlled cell in the plurality of battery cells according to a detection result generated by the detection module. The adjusting module is electrically connected to the battery management module, wherein if the controlled cell is not found in the plurality of battery cells, the battery management module controls the adjusting module to execute a battery cell balancing procedure until the controlled cell found. The definition of the controlled cell is the one that reaches the operation limit, maximum charge voltage during charging and minimum discharge voltage during discharging, among the plurality of battery cells.

A controlled cell may exhibit the minimum capacity or the maximum resistance or the aforementioned combination among the plurality of battery cells.

The battery management method comprises the following steps: executing a battery checking procedure; determining whether the plurality of battery cells have a controlled cell; and if none has been found, executing a battery cell balancing procedure until the controlled cell found.

DETAILED DESCRIPTION OF THE PREFERRED EMBODIMENTS

These and other objects and advantages of the present invention will become apparent from the following description of the accompanying drawings, which disclose several embodiments of the present invention. It is to be understood that the drawings are to be used for purposes of illustration only, and not as a definition of the invention.

Figure 1:
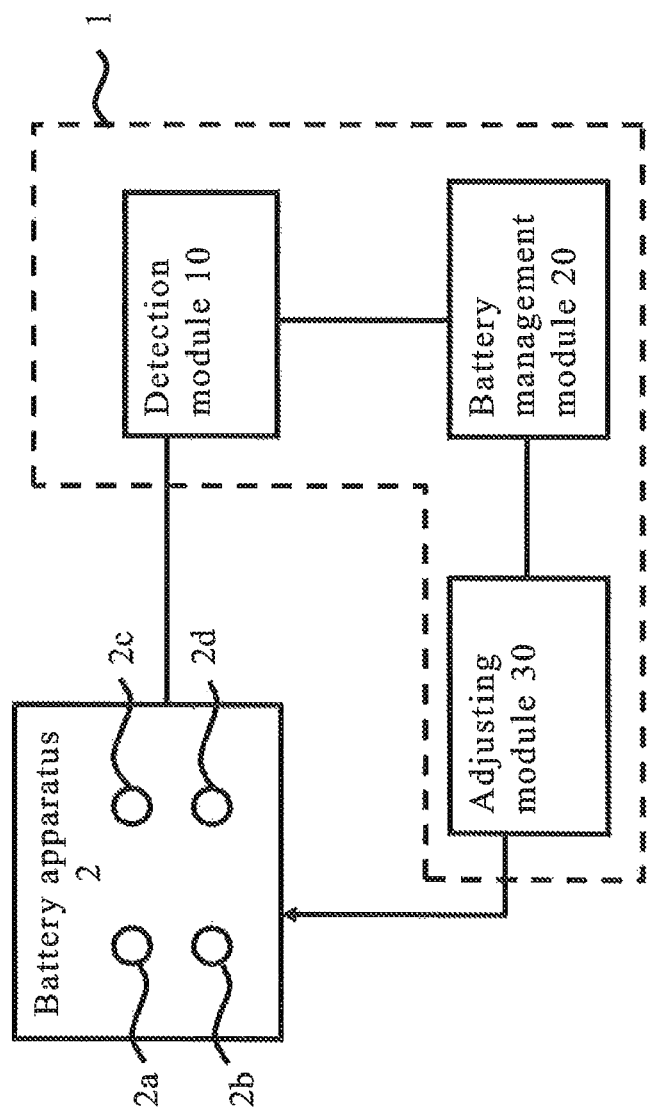
FIG. 1 is a structure diagram illustrating a battery cell balancing control system of the present invention.

Please refer to FIG. 1, which is a structure diagram illustrating a battery cell balancing control system of the present invention.

Figure 2:
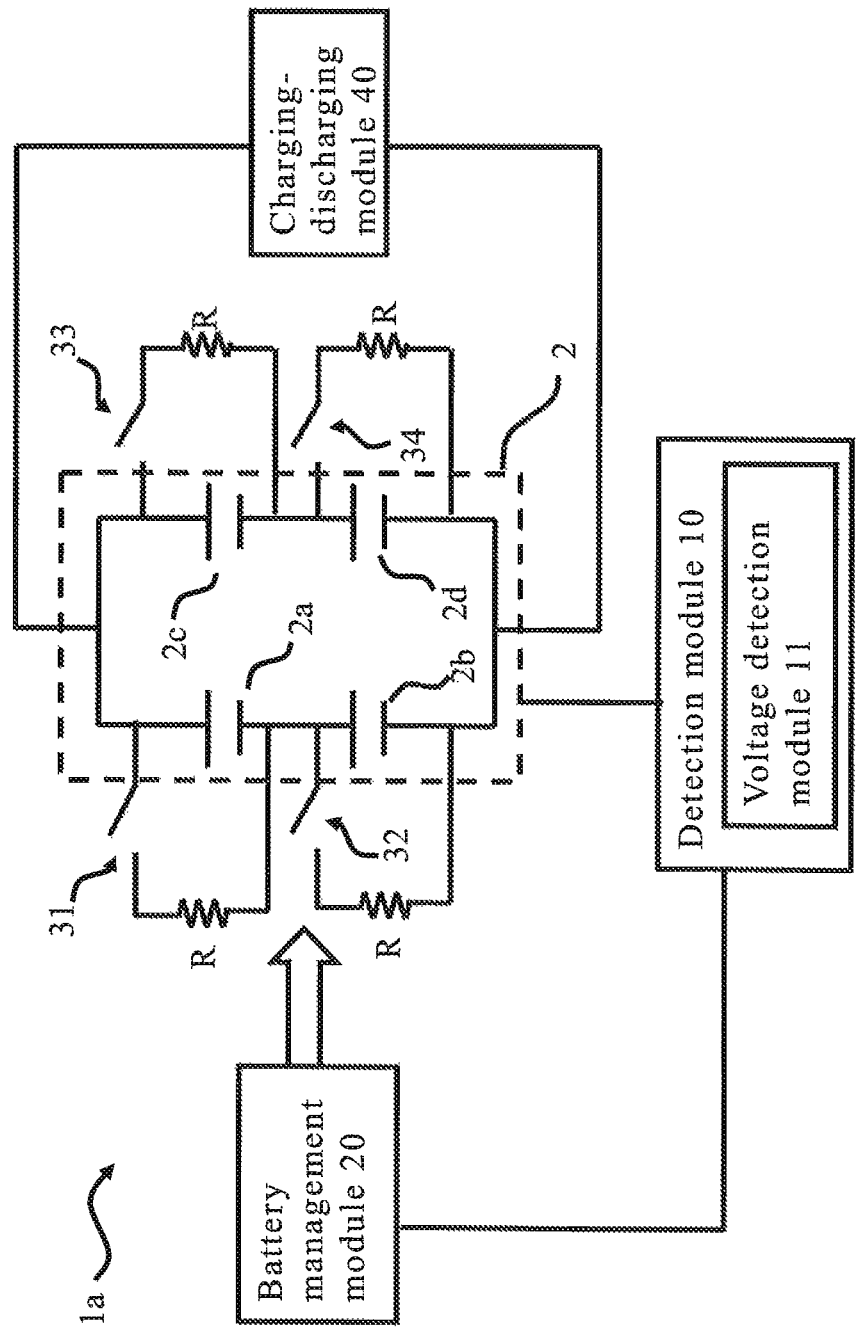
FIG. 2 is a structure diagram illustrating a battery cell balancing control system of a first embodiment of the present invention.

A battery cell balancing control system 1 of the present invention is used for managing a battery apparatus 2. The battery apparatus 2 has a plurality of battery cells 2a, 2b, 2c, and 2d (as shown in FIG. 1), but the present invention is not limited to this amount. The battery cell balancing control system 1 is used for managing a charging and discharging procedure of the battery apparatus 2, such that the battery apparatus 2 is able to perform with the best efficacy. The battery cell balancing control system 1 comprises a detection module 10, a battery management module 20, and an adjusting module 30. The detection module 10 is used for executing a battery checking procedure on the plurality of battery cells 2a, 2b, 2c, and 2d to find which battery cell of the plurality of battery cells 2a, 2b, 2c, and 2d is a controlled cell, wherein the controlled cell is the battery cell with a minimum capacity or a maximum resistance or a combination of the both conditions. The battery management module 20 is electrically connected to the detection module 10 for determining whether the controlled cell is found in the plurality of battery cells 2a, 2b, 2c, and 2d with the detection result generated by the detection module 10. The adjusting module 30 is electrically connected to the battery management module 20 and is used for adjusting the state of charge of the battery cells 2a, 2b, 2c, and 2d simultaneously or individually. The adjusting module 30 may comprise a plurality of switch modules 31, 32, 33, and 34 and resistors R (as shown in FIG. 2), but the present invention is not limited by this specification. If the controlled cell is not able to be determined among the plurality of battery cells 2a, 2b, 2c, and 2d at the moment, the battery management module 20 controls the adjusting module 30 to execute a battery cell balancing procedure on the battery apparatus 2. The battery cell balancing procedure would be executed continuously until the controlled cell has been found, which improves a charge and discharge performance of the battery apparatus 2.

Next, please refer to FIG. 2, which is a structure diagram illustrating a battery cell balancing control system of a first embodiment of the present invention.

In the first embodiment of the present invention, the battery cell balancing control system 1a comprises a detection module 10, a battery management module 20, a plurality of switch modules 31, 32, 33, 34, resistors R, and a charging-discharging module 40. The plurality of switch modules 31, 32, 33, and 34 and the resistors R can be the adjusting module 30 as aforementioned, but the present invention is not limited by this embodiment. The charging-discharging module 40 is used for executing a charging procedure and a discharging procedure on the battery apparatus 2 to allow the battery apparatus 2 to be charged by or discharged to another electronic apparatus.

The detection module 10 in the first embodiment has a voltage detection module 11. When the charging-discharging module 40 executes the charging procedure or the discharging procedure on the battery apparatus 2, the voltage detection module 11 detects a voltage of each battery cell 2a, 2b, 2c, and 2d of the battery apparatus 2. As shown in FIG. 2, the battery cells 2a, 2b, 2c, and 2d can be connected in series or in parallel to each other, but the present invention is not limited by this circuit. Thus, when the battery, cell balancing control system 1 controls the battery apparatus 2, the charging-discharging module 40 executes both the charging procedure and the discharging procedure on the battery apparatus 2 first. Upon the charging procedure being executed to charge the battery apparatus 2 to a predetermined maximum point, the voltage detection module 11 is used for measuring the voltage of each battery cell 2a, 2b, 2c, and 2d to find a cell with a highest charged voltage. In addition, when the discharging procedure is executed to discharge the battery apparatus 2 to a predetermined minimum point, the voltage detection module 11 is also used for measuring the voltage of each battery cell 2a, 2b, 2c, and 2d to find a cell with a lowest discharged voltage. The aforementioned predetermined maximum and minimum point can be defined for the voltage of battery apparatus 2 or the battery cell 2a, 2b, 2c, or 2d, respectively.

Then the battery management module 20 executes the following management process according to the detection result generated by the voltage detection module 11. First, the battery management module 20 determines whether the cell with the highest charged voltage and the cell with the lowest discharged voltage have both been located. If the cell with the highest charged voltage and the cell with the lowest discharged voltage are found in the plurality of battery cells 2a, 2b, 2c, and 2d when the charging or discharging procedure is executed, it indicates a difference in fully charged capacity and/or state of charge among the plurality of battery cells 2a, 2b, 2c, and 2d. Then the battery management module 20 further determines whether the cell with the highest charged voltage and the cell with the lowest discharged voltage are the same battery cell. If the cell with the highest charged voltage and the cell with the lowest discharged voltage are different battery cells, the battery management module 20 confirms that the plurality of battery cells 2a, 2b, 2c, and 2d need to be adjusted individually when the battery apparatus 2 is charging or discharging. In addition, in the preferred embodiment of the present invention, when the battery management module 20 confirms that the cell with the highest charged voltage and the cell with the lowest discharged voltage are different battery cells, the battery management module 20 further determines whether a difference in a state of charge between the cell with the highest charged voltage and the cell with the lowest discharged voltage is greater than a predetermined value. For example, if the difference in the state of charge between the cell with the highest charged voltage and the cell with the lowest discharged voltage is greater than 2% of the maximum capacity it is confirmed that the battery apparatus 2 needs to be adjusted. As a result, the battery management module 20 knows which battery cell is the cell with the lowest discharged voltage in the battery apparatus 2.

Figure 2A:
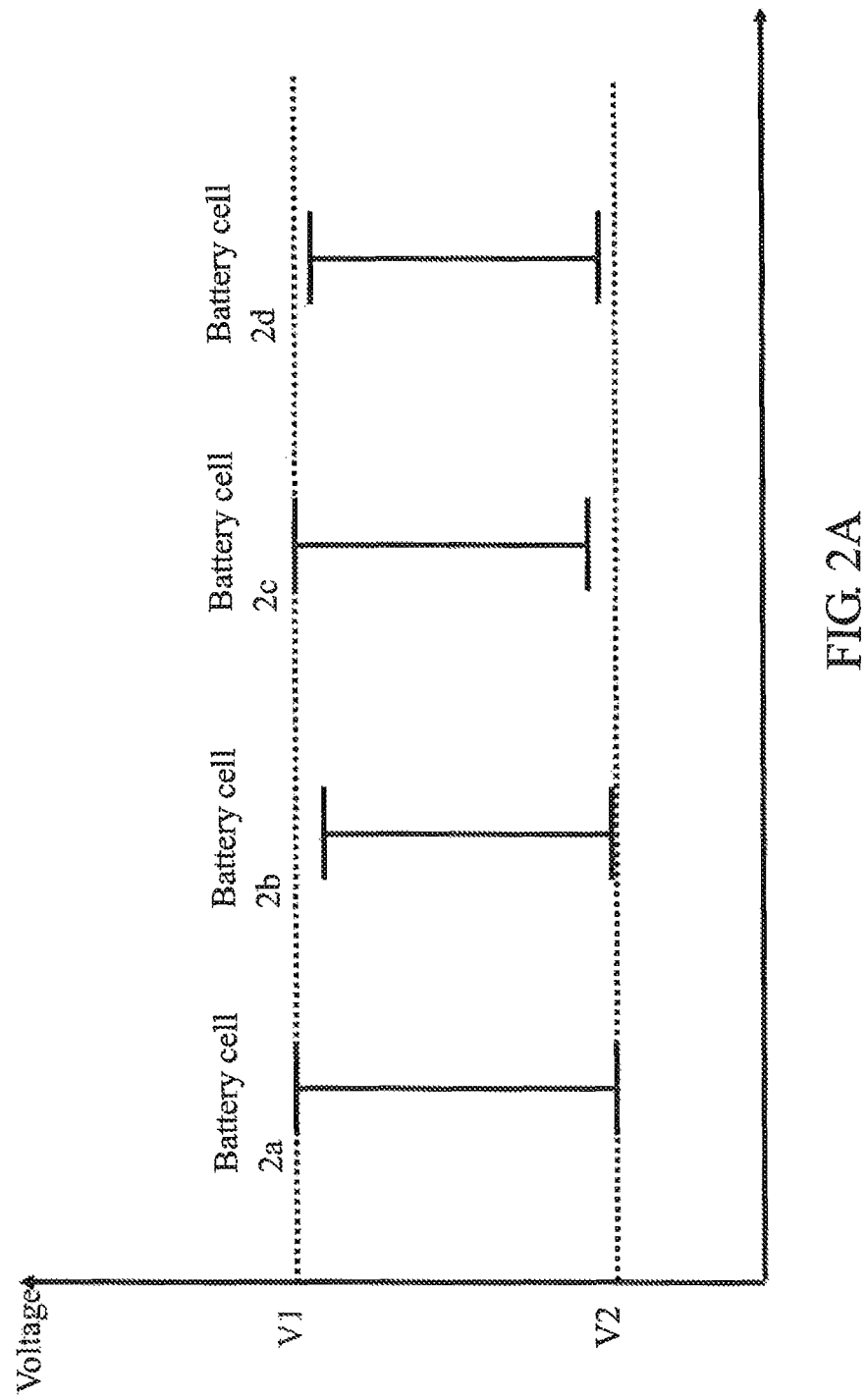
FIG. 2A is an electrical diagram illustrating a plurality of battery cells of the present invention.

When the cell with the lowest discharged voltage is found, the battery management module 20 defines the cell with the lowest discharged voltage as a candidate of the controlled cell, and controls the adjusting module 30 to execute the battery cell balancing procedure according to a capacity of the candidate of the controlled cell. The adjusting module 30 may comprise a plurality of switch modules 31, 32, 33, and 34 and resistors R. The plurality of switch modules 31, 32, 33, and 34 and the resistors R are electrically connected to the plurality of battery cells 2a, 2b, 2c, and 2d individually, but the present invention is not limited by this circuit, as shown in FIG. 2. Thus, the adjusting module 30 is capable of adjusting the state of charge of each battery cell. Please also refer to FIG. 2A, which is an electrical diagram illustrating a plurality of battery cells of the present invention.

After the aforementioned procedure is executed for several times and the controlled cell has been found, it indicates the completion of the balance process, that is when the battery management module 20 determines that the battery cell 2a is the controlled cell which has a highest charged voltage V1 and a lowest discharged voltage V2, or the battery cell 2a has a lowest discharged voltage V2 but another cell has a highest charged voltage with the difference in the state of charge to the cell 2a less than 2%.

For the case the battery cell 2a is the controlled cell with a lowest discharged voltage V2 only, and the battery cell 2c has the highest charged voltage V1 with the difference in the state of charge to the cell 2a higher than 2%, the battery management module 20 switches the switch modules 33 to adjust the state of charge of the battery cell 2c according to the fully charged capacity of the battery cell 2a. If the battery cell 2c has the lowest discharged voltage V2 instead of the battery cell 2a after adjustment (with the difference in the state of charge between the battery cell 2a and the battery cell 2c less than 2%), then the battery cell 2c becomes the controlled cell of the plurality of battery cells. Obviously, this embodiment is not this case.

Furthermore, when the battery management module 20 is checking the battery apparatus 2, the battery management module 20 can also determine the capacity of the controlled cell in the battery apparatus 2. If the capacity of the controlled cell is obviously reduced due to various causes, e.g. aging, original defect inside, and so on, the performance of the battery apparatus 2 will be limited. Therefore, the battery management module 20 is used for generating a maintenance notification message when the capacity of the controlled cell is smaller than a threshold capacity so as to notify the user to replace the controlled cell. Since the battery management module 20 adjusts the other battery cells 2b, 2c, and 2d according to the capacity of the battery cell 2a, the battery cell 2a should be the most stressed one among all the battery cells. Therefore, the battery cell 2a should be the first one to be replaced when the battery apparatus 2 cannot deliver acceptable capacity, instead of the whole battery apparatus 2 being replaced.

The detection module 10 is used for re-executing the battery checking procedure on the battery apparatus 2 periodically or when a using state is changed. For example, when one of the battery cells is replaced, the detection module 10 will re-execute the battery checking procedure on detecting the battery apparatus 2. In addition, the detection module 10 may check the battery apparatus 2 regularly, but the present invention is not limited to this schedule.

A point to note is that the detection module 10, the battery management module 20, the adjusting module 30, and the charging-discharging module 40 of the battery cell balancing control system 1 of the present invention can be implemented in the form of hardware, firmware, a combination of hardware and firmware, or a combination of hardware and software, and the present invention is not limited thereto.

Figure 3A:
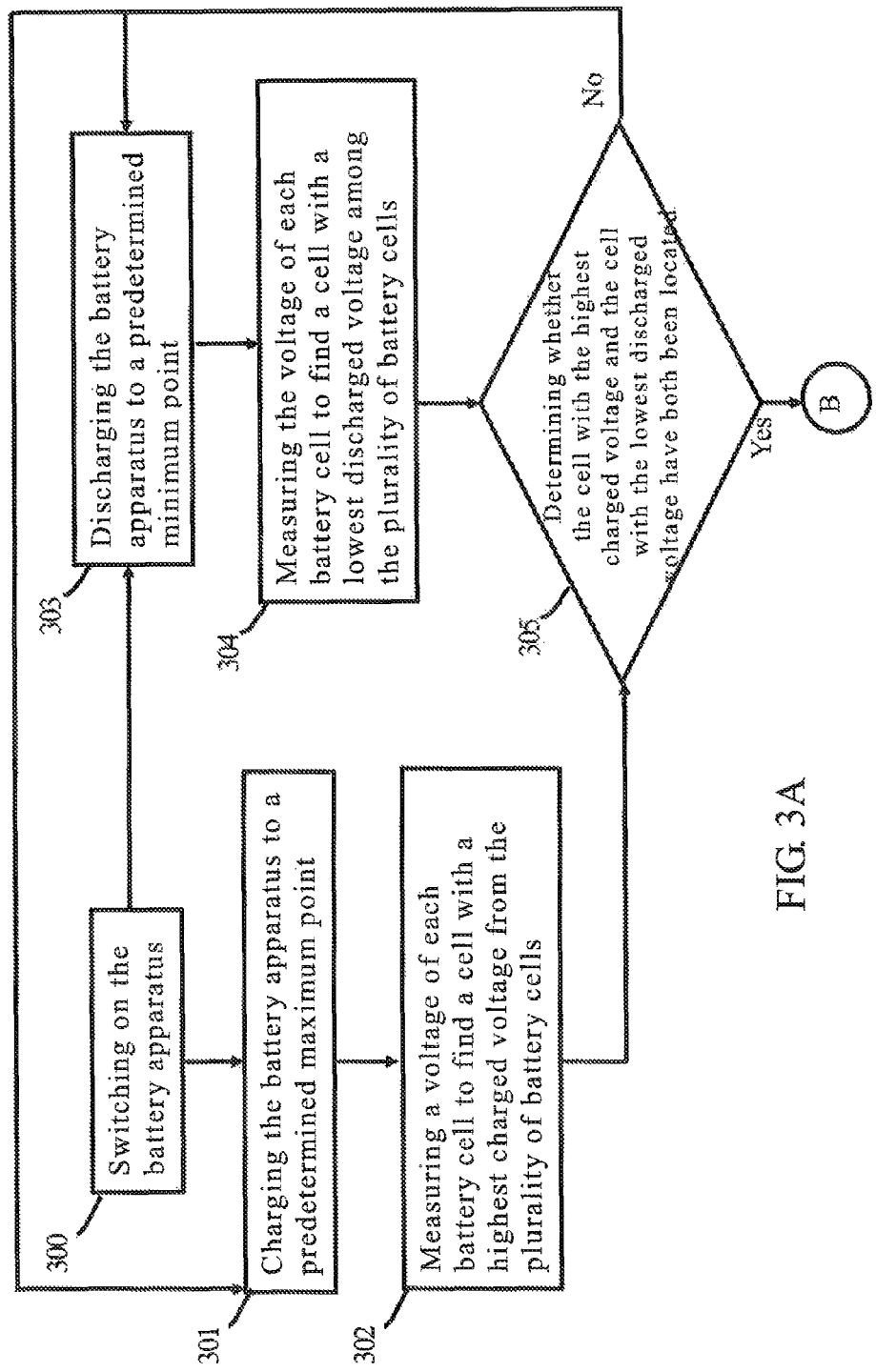
FIGS. 3A-3B are step flowcharts of the battery cell balancing control method of the first embodiment of the present invention.
Figure 3B:
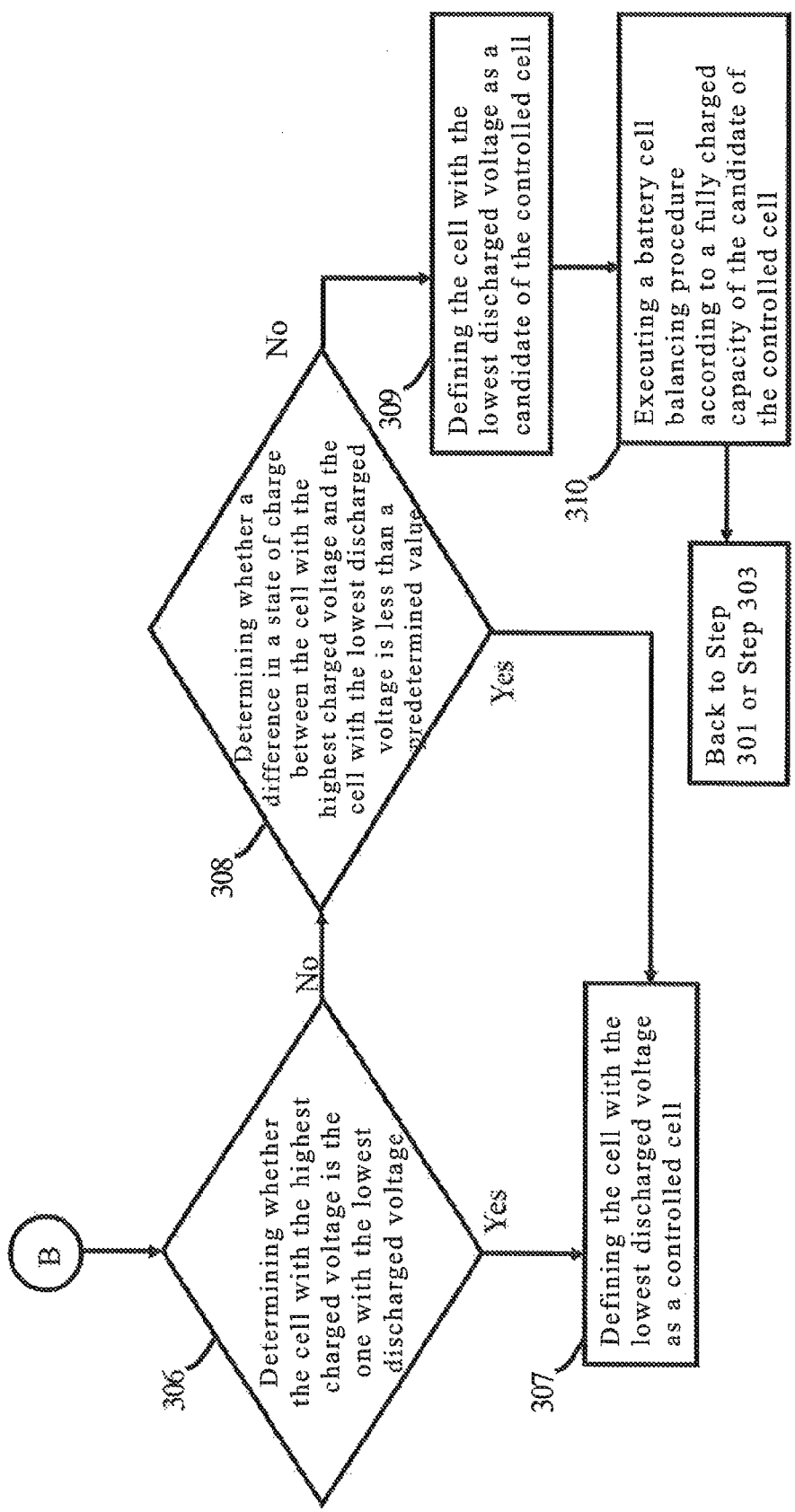

Next, please refer to FIG. 3A-3B, which are flow charts illustrating the battery cell balancing control method of the first embodiment of the present invention. It should be noted here that, although in the following, the battery cell balancing control system 1 is used as an example to describe the battery cell balancing control method of the present invention, the battery cell balancing control of the invention is not limited by the battery cell balancing control system 1.

First, Step 300 is performed: switching on the battery apparatus.

First, the battery cell balancing control system 1 electrically connects to the battery apparatus 2 to switch on the battery apparatus 2.

Next, Step 301 is performed: charging the battery apparatus to a predetermined maximum point.

In this step, the charging-discharging module 40 charges the battery apparatus 2. The battery apparatus 2 is charged to a predetermined maximum point, which can be defined by voltage of the battery apparatus 2 or the battery cell 2a, 2b, 2c, or 2d, respectively.

Then Step 302 is performed: measuring a voltage of each battery cell to find a cell with a highest charged voltage among the plurality of battery cells.

In this step, the detection module 10 measures a voltage of each battery cell of the plurality of battery cells 2a, 2b, 2c, and 2d when the battery apparatus 2 is charged to a predetermined maximum point so that the detection module 10 can determine which battery cell has the highest voltage and mark the battery cell as the candidate of the controlled cell.

In addition, Step 303 is performed: discharging the battery apparatus to a predetermined minimum point. It is noted that Step 303 and Step 304 can be performed right directly after Step 300, or followed by Step 301 and Step 302.

The charging-discharging module 40 discharges the battery apparatus 2. Therefore, the battery apparatus 2 can be discharged to a predetermined minimum point, which can be defined by voltage of the battery apparatus 2 or the battery cell 2a, 2b, 2c, or 2d, respectively.

Then Step 304 is performed: measuring the voltage of each battery cell to find a cell with a lowest discharged voltage among the plurality of battery cells.

Similarly, the detection module 10 measures a voltage of each battery cell of the plurality of battery cells 2a, 2b, 2c, and 2d so that the detection module 10 can determine which battery cell has the lowest discharged voltage and mark the battery cell as the candidate of the controlled cell.

After information collected in Step 302 and Step 304, Step 305 is performed: determining whether the cell with the highest charged voltage and the cell with the lowest discharged voltage have both been located.

The battery management module 20 determines whether the cell with the highest charged voltage and the cell with the lowest discharged voltage have both been located. It means the battery management module 20 determines whether the state of the charge of the plurality of battery cells 2a, 2b, 2c, and 2d of the battery apparatus 2 are the same.

If the cell with the highest charged voltage and the cell with the lowest discharged voltage have both been located, it indicates a difference in fully charged capacity and/or state of charge among the plurality of battery cells 2a, 2b, 2c, and 2d. Therefore Step 306 is performed: determining whether the cell with the highest charged voltage is the one with the lowest discharged voltage. If the cell with the highest charged voltage and the cell with the lowest discharged voltage have not both been located, then the process goes back to Step 301 or Step 303 for executing the charging or discharging procedure to the plurality of battery cells 2a, 2b, 2c, and 2d again.

Then the battery management module 20 can determine whether the cell with the highest charged voltage is the one with the lowest discharged voltage.

If the cell with the highest charged voltage and the cell with the lowest discharged voltage are the same battery cell, then Step 307 is performed: defining the cell with the lowest discharged voltage as a controlled cell.

If the battery management module 20 determines the cell with the highest charged voltage is the one with the lowest discharged voltage, the battery management module 20 will mark the cell as the controlled cell.

If the cell with the highest charged voltage is not the one with the lowest discharged voltage, Step 308 is performed: determining whether a difference in a state of charge between the cell with the highest charged voltage and the cell with the lowest discharged voltage is greater than a predetermined value.

The battery management module 20 further determines whether a difference in a state of charge between the cell with the highest charged voltage and the cell with the lowest discharged voltage is less than a predetermined value. For example, the difference in state of the charge between the cell with the highest charged voltage and the cell with the lowest discharged voltage may be less than 2% of the maximum capacity, but the present invention is not limited to this value.

If yes, the method goes to Step 308 to define the cell with the lowest discharged voltage as the controlled cell.

If the difference in the state of charge between the cell with the highest charged voltage and the cell with the lowest discharged voltage is less than the predetermined value, for example, less than 2% of the maximum capacity the battery management module 20 defines the cell with the lowest discharged voltage as the controlled cell.

If the difference in the state of charge between the cell with the highest charged voltage and the cell with the lowest discharged voltage is greater than the predetermined value, then Step 309 is performed: defining the cell with the lowest discharged voltage as a candidate of the controlled cell.

It indicates if the difference in state of the charge between the cell with highest charged voltage and the cell with the lowest discharged voltage is greater than a predetermined value, the battery management module 20 defines the cell with the lowest discharged voltage as a candidate of the controlled cell.

Then Step 310 is performed: executing a battery cell balancing procedure according to a fully charged capacity of the candidate of the controlled cell.

Then the battery management module 20 controls the adjusting module 30 to execute a battery cell balancing procedure according to a fully charged capacity of the candidate of the controlled cell such that the adjusting module 30 is able to adjust state of the charge of the other battery cells using the associated passive resistor R. For each balance process the battery cells other than controlled one are discharged using the associated resistors for a predetermined time or quantity of electric charge.

Furthermore, the battery management module 20 is used for generating a maintenance notification message when the capacity of the controlled cell is smaller than a threshold capacity so as to notify the user to replace the controlled cell.

Finally, the method goes back to Step 301 or Step 303 for charging or discharging the plurality of battery cells 2a, 2b, 2c, and 2d. The Step 301 to Step 306 will proceed repeatedly until the difference in state of the charge between the cell with highest charged voltage and the cell with the lowest discharged voltage is less than the predetermined value, which indicates the controlled cell found. As a result, the battery management module 20 will not execute the battery cell balancing procedure.

In addition, the detection module 10 can re-execute the battery checking procedure on the battery apparatus 2 periodically or when a using state is changed.

Figure 4:
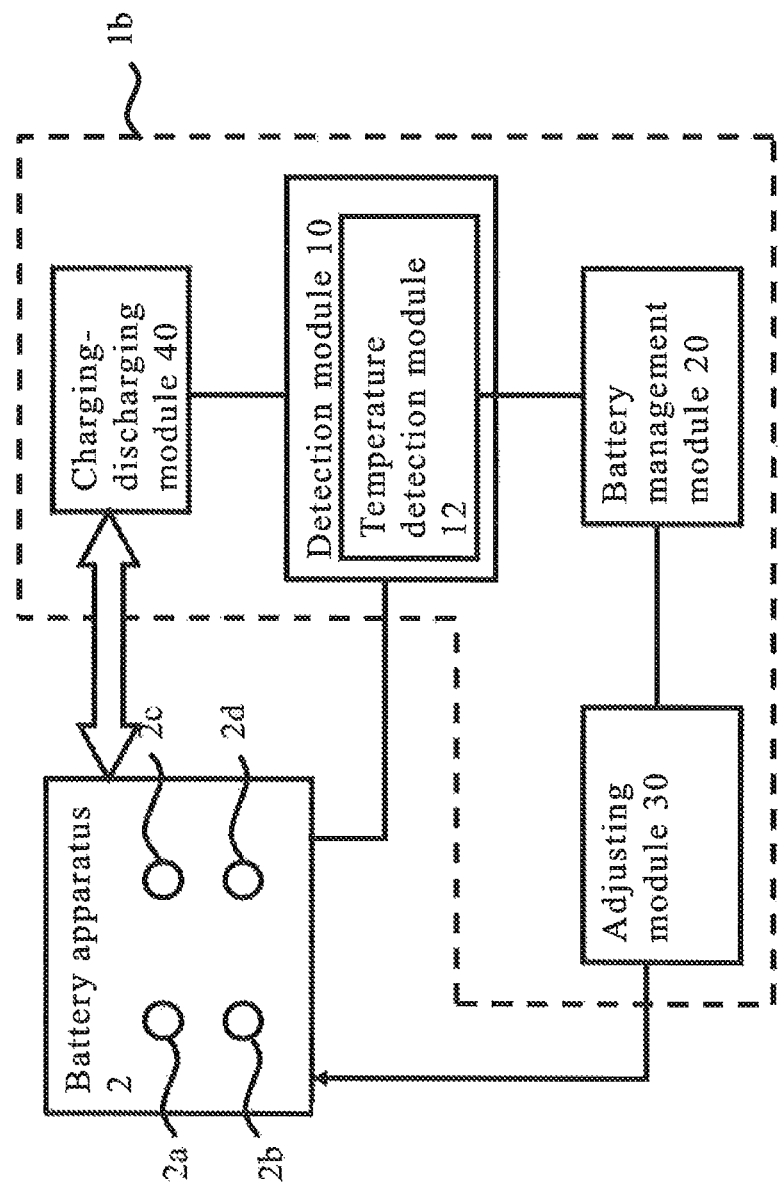
FIG. 4 is a structure diagram illustrating a battery cell balancing control system of a second embodiment of the present invention.

Next, please refer to FIG. 4, which is a structure diagram illustrating a battery cell balancing control system of a second embodiment of the present invention.

In the second embodiment of the present invention, the battery cell balancing control system 1b comprises a detection module 10, a battery management module 20, an adjusting module 30, and a charging-discharging module 40. Similarly, the charging-discharging module 40 is used for executing a charging procedure and a discharging procedure on the battery apparatus 2 to allow the battery apparatus 2 to be charged or discharged to another electronic apparatus. The detection module 10 in the second embodiment has a temperature detection module 12. Upon the charging-discharging module 40 executing the charging procedure and the discharging procedure on the battery apparatus 2 at the same rate, the temperature detection module 12 is used for detecting the temperature of every battery cell 2a, 2b, 2c, and 2d of the battery apparatus 2. When the battery cells 2a, 2b, 2c, and 2d are charged or discharged at the same rate, a battery cell with a smaller capacity or higher resistance will have a greater temperature increase. The temperature detection module 12 is able to find a cell with a maximum temperature increase. The cell with the maximum temperature increase is the minimum capacity or maximum resistance battery cell. Therefore, the battery management module 20 is used for defining the cell with the maximum temperature increase as the controlled cell and for controlling the adjusting module 30 to adjust other battery cells according to the capacity of the controlled cell. Thus, the state of charge of other battery cells can be adjusted. Because the adjusting procedure of the second embodiment is the same as that in the first embodiment, further detailed description is omitted.

Figure 5:
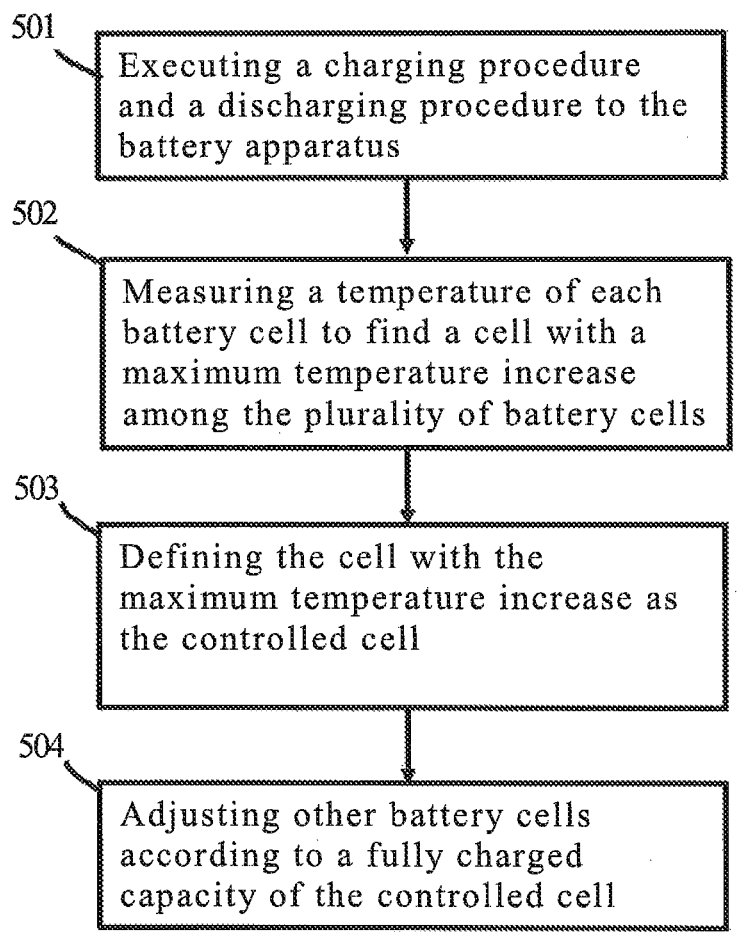
FIG. 5 is a step flowchart of the battery cell balancing control method of the second embodiment of the present invention.

Please refer to FIG. 5, which is a step flowchart of the battery cell balancing control method of the second embodiment of the present invention.

In the second embodiment, Step 501 is first performed: executing a charging procedure and a discharging procedure on the battery apparatus.

First, the charging-discharging module 40 executes a charging procedure and a discharging procedure on the battery apparatus 2 at the same rate to allow the battery apparatus 2 to be charged or discharged to another electronic apparatus.

Next, Step 502 is performed: measuring the temperature of each battery cell to find a cell with a maximum temperature increase among the plurality of battery cells.

Next, upon the charging-discharging module 40 executing the charging procedure and the discharging procedure on the battery apparatus 2, the temperature detection module 12 detects the temperature of every battery cell 2a, 2b, 2c, and 2d of the battery apparatus 2 so as to find a cell with a maximum temperature increase. The cell with the maximum temperature increase is the minimum capacity or maximum resistance battery cell.

Then Step 503 is performed: defining the cell with the maximum temperature increase as the controlled cell.

Then the battery management module 20 defines the cell with the maximum temperature increase as the controlled cell.

Finally, Step 504 is performed: adjusting other battery cells according to a fully charged capacity of the controlled cell.

Finally the battery management module 20 controls the adjusting module 30 to adjust the state of charge of other battery cells according to the fully charged capacity of the controlled cell.

Figure 6:
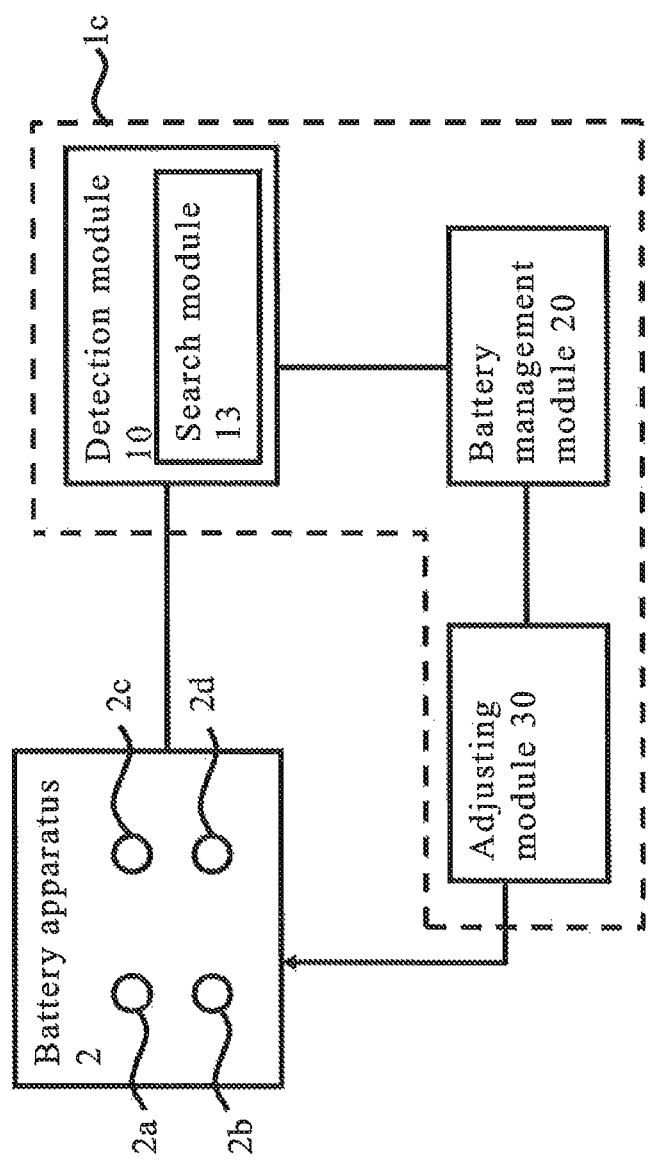
FIG. 6 is a structure diagram illustrating a battery cell balancing control system of a third embodiment of the present invention.

Please refer to FIG. 6, which is a structure diagram illustrating a battery cell balancing control system of a third embodiment of the present invention.

In the third embodiment of the present invention, the battery cell balancing control system 1c comprises a detection module 10, a battery management module 20, and an adjusting module 30. When the battery apparatus 2 is manufactured, a cell with smaller capacity or higher resistance is assembled into the battery apparatus 2 and set as a marked cell. The detection module 10 has a search module 13 used for searching the battery cells 2a, 2b, 2c, and 2d of the battery apparatus 2 to find the marked cell. In some cases, the marked cell is well recognized in the battery apparatus 2 without searching module since it is intended to be assembled within. Then the battery management module 20 is used for defining the marked cell as the controlled cell and for controlling the adjusting module 30 to adjust other battery cells according to the capacity of the controlled cell. Thus, the state of charge of other battery cells can be adjusted. Because the adjusting procedure of the third embodiment is the same as that of the first embodiment, further detailed description is omitted.

Figure 7:
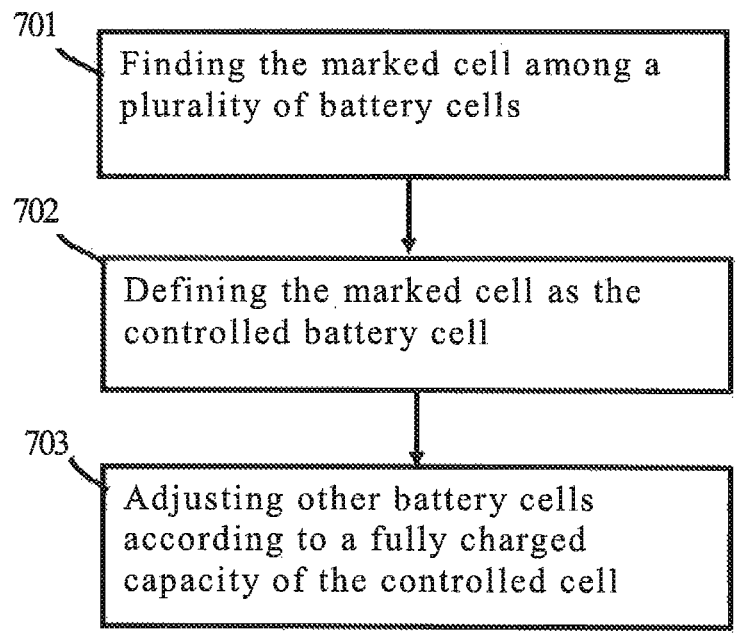
FIG. 7 is a step flowchart of the battery cell balancing control method of the third embodiment of the present invention.

Finally, please refer to FIG. 7, which is a step flowchart of the battery cell balancing control method of the third embodiment of the present invention.

First, Step 701 is performed: finding the marked cell among the plurality of battery cells.

First, the search module 13 searches the battery cells 2a, 2b, 2c, and 2d of the battery apparatus 2 to find the marked cell.

Next, Step 702 is performed: defining the marked cell as the controlled cell.

Next, the battery management module 20 defines the marked cell as the cell.

Finally, Step 703 is performed: adjusting other battery cells according to a fully charged capacity of a controlled cell.

The battery management module 20 controls the adjusting module 30 to adjust the state of charge of other battery cells according to the fully charged capacity of the controlled cell.

Therefore, by the battery cell balancing control systems 1, 1*a*, 1*b*, or 1*c* of the present invention, each battery cell 2*a*, 2*b*, 2*c*, and 2*d* of the battery apparatus 2 can be managed, and the problem of the prior art can thus be solved.

It is noted that the aforementioned embodiments are only for illustration. It is intended that the present invention cover modifications and variations of the present invention provided they fall within the scope of the following claims and their equivalents. Therefore, it will be apparent to those skilled in the art that various modifications and variations can be made to the structure of the present invention without departing from the scope or spirit of the invention.

What is claimed is:

1. A battery management method for a battery cell balancing control system for managing a battery apparatus, wherein the battery apparatus has a plurality of battery cells, the method comprising the following steps:
   executing a battery checking procedure;
   determining whether the plurality of battery cells has a controlled cell, wherein the controlled cell is the battery cell with a minimum capacity or a maximum resistance or composed of both of them;
   if yes, skipping the battery cell balancing procedure; and
   if no, executing a battery cell balancing procedure until the controlled cell is found, wherein the step of executing the battery checking procedure further comprises:
      executing a charging procedure to charge the battery apparatus to a predetermined maximum point;
      measuring a voltage of each battery cell to find a cell with a highest charged voltage;
      executing a discharging procedure to discharge the battery apparatus to a predetermined minimum point;
      measuring the voltage of each battery cell to find a cell with a lowest discharged voltage;
      determining whether the cell with the highest charged voltage and the cell with the lowest discharged voltage have both been located;
      if the cell with the highest charged voltage and the cell with the lowest discharged voltage have both been located, determining whether the cell with the highest charged voltage and the cell with the lowest discharged voltage are the same battery cell;
      if the cell with the highest charged voltage and the cell with the lowest discharged voltage are the same battery cell, then marked the cell as the controlled cell;
      if the cell with the highest charged voltage and the cell with the lowest discharged voltage are different battery cells, defining the cell with the lowest discharged value as a candidate of the controlled cell; and
      executing the battery cell balancing procedure according to the candidate of the controlled cell repeatedly until the cell with the highest charged voltage and the cell with the lowest discharged voltage are the same battery cell.

2. The battery management method as claimed in claim 1, wherein when the cell with the highest charged voltage and the cell with the lowest discharged voltage are different battery cells, the method further comprises the following steps:
   determining whether a difference in a state of charge between the cell with the highest charged voltage and the cell with the lowest discharged voltage is greater than a predetermined value;
   if yes, defining the cell with the lowest discharged voltage as the controlled cell;
   if no, defining the cell with the lowest discharged voltage as the candidate of the controlled cell; and
   executing the battery cell balancing procedure according to the candidate of the controlled cell repeatedly until the difference in the state of charge between the cell with the highest charged voltage and the candidate of the controlled is smaller than the predetermined value.

3. The battery management method as claimed in claim 2, wherein the step of executing the battery cell balancing procedure further comprises:
   adjusting the state of charge of other battery cells according to a fully charged capacity of the candidate of the controlled cell.

4. The battery management method as claimed in claim 1, wherein the step of executing the battery checking procedure further comprises:
   executing a charging procedure and a discharging procedure on the battery apparatus;
   measuring the temperature of each battery cell to find a cell with a maximum temperature increase; and
   defining the cell with the maximum temperature increase as the controlled cell.

5. The battery management method as claimed in claim 1, further comprising a step of disposing a marked cell in the plurality of battery cells in advance, wherein the marked cell is the battery cell of smaller capacity or higher resistance or composed of both of them.

6. The battery management method as claimed in claim 5, wherein the step of executing the battery checking procedure further comprises:
   finding the marked cell among the plurality of battery cells; and
   defining the marked cell as the controlled cell.

7. The battery management method as claimed in claim 1, further comprising the following step:
   if a capacity of the controlled cell is smaller than a threshold capacity, generating a maintenance notification message.

8. The battery management method as claimed in claim 1, further comprising the following step:
   re-executing the battery checking procedure on the battery apparatus periodically or when a using state is changed.

9. A battery cell balancing control system for managing a battery apparatus, wherein the battery apparatus has a plurality of battery cells, the battery cell balancing control system comprising:
   a detection module for executing a batter checking procedure on the plurality of battery cells to generate a detection result;
   a battery management module electrically connected to the detection module for determining whether the plurality of battery cells has a controlled cell according to the detection result, wherein the controlled cell is the battery cell with a minimum capacity or a maximum resistance or composed of both of them;
   an adjusting module electrically connected to the battery management module, wherein if the controlled cell has not been found among the plurality of battery cells, the battery management module controls the adjusting module to execute a battery cell balancing procedure until the controlled cell is found; if the controlled cell has found, the battery management module controls the adjusting module to disable the battery cell balancing procedure; and a charging-discharging module used for executing a charging procedure and a discharging procedure on the battery apparatus, wherein the detection module comprises a voltage detection module for measuring the voltage of each battery cell to find a cell with a highest charged voltage when the battery apparatus is charged to a predetermined maximum point, and for measuring the voltage of each battery cell to find a cell with a lowest discharged voltage when the battery apparatus is discharged to a predetermined minimum point, such that the battery management module is used for determining whether the cell with the highest charged voltage and the cell with the lowest discharged voltage have both been located; if the cell with the highest charged voltage and the cell with the lowest discharged voltage have both been located, the battery management module is used for determining whether the cell with the highest charged voltage and the cell with the lowest discharged voltage are the same battery cell; if the cell with the highest charged voltage and the cell with the lowest discharged voltage are the same battery cell, the battery management module is used for defining the cell as the controlled cell; if the cell with the highest charged voltage and the cell with the lowest discharged voltage are different battery cells, the battery management module is used for defining the cell with the lowest discharged voltage as a candidate of the controlled cell and controlling the adjusting module to execute the battery cell balancing procedure according to the candidate of the controlled cell repeatedly until the cell with the highest charged voltage and the cell with the lowest discharged voltage are the same battery cell.

10. The battery cell balancing control system as claimed in claim 9, wherein the battery management module further determines whether a difference in a state of charge between the cell with the highest charged voltage and the cell with the lowest discharged voltage is greater than a predetermined value; if yes, the battery management module defines the cell with the lowest discharged voltage as the controlled cell; if no, the battery management module defines the cell with the lowest discharged voltage as the candidate of the controlled cell.

11. The battery cell balancing control system as claimed in claim 10, wherein the battery management module is used for controlling the adjusting module to adjust the state of charge of other battery cells according to a fully charged capacity of the candidate of the controlled cell.

12. The battery cell balancing control system as claimed in claim 9, the battery cell balancing control system further comprising a charging-discharging module for executing a charging procedure and a discharging procedure on the battery apparatus, wherein the detection module comprises a temperature detection module for measuring the temperature of each battery cell to find a cell with a maximum temperature increase; such that the battery management module is used for defining the cell with the maximum temperature increase as the controlled cell.

13. The battery cell balancing control system as claimed in claim 9, wherein a marked cell is disposed in the plurality of battery cells previously; wherein the marked cell is the battery cell of smaller capacity or higher resistance or composed of both of them.

14. The battery cell balancing control system as claimed in claim 13, wherein the detection module comprises a search module for finding the marked cell among the plurality of battery cells;

such that the battery management module is used for defining the marked cell as the controlled cell.

15. The battery cell balancing control system as claimed in claim 9, wherein the battery management module is used for generating a maintenance notification message when the capacity of the controlled cell is smaller than a threshold capacity.

16. The battery cell balancing control system as claimed in claim 9, wherein the detection module is used for re-executing the battery checking procedure on the battery apparatus periodically or when a using state is changed.

* * * * *